US010889082B2

(12) United States Patent
Miura

(10) Patent No.: US 10,889,082 B2
(45) Date of Patent: Jan. 12, 2021

(54) LAMINATED STRUCTURE AND METHOD FOR PRODUCING THE SAME

(71) Applicant: SONY CORPORATION, Tokyo (JP)

(72) Inventor: Toshihiro Miura, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 16/092,821

(22) PCT Filed: Mar. 24, 2017

(86) PCT No.: PCT/JP2017/012028
§ 371 (c)(1),
(2) Date: Oct. 11, 2018

(87) PCT Pub. No.: WO2017/183390
PCT Pub. Date: Oct. 26, 2017

(65) Prior Publication Data
US 2019/0118503 A1 Apr. 25, 2019

(30) Foreign Application Priority Data

Apr. 20, 2016 (JP) ................. 2016-084243

(51) Int. Cl.
B32B 3/18 (2006.01)
H01L 21/768 (2006.01)
(Continued)

(52) U.S. Cl.
CPC .............. *B32B 3/18* (2013.01); *H01L 21/022* (2013.01); *H01L 21/768* (2013.01);
(Continued)

(58) Field of Classification Search
CPC ..... Y10T 428/19; Y10T 428/195; B32B 3/18; H01L 23/10; H01L 23/3192; H01L 23/562; H01L 21/76832; H01L 21/76834
See application file for complete search history.

(56) References Cited

U.S. PATENT DOCUMENTS 8,673,725 B2 * 3/2014 O'Meara ............. H01L 29/6656
257/900
2001/0036728 A1 11/2001 Shinmura et al.
(Continued)

FOREIGN PATENT DOCUMENTS

CN 1790740 6/2006
JP S57-193045 11/1982
(Continued)

OTHER PUBLICATIONS

International Search Report prepared by the Japan Patent Office dated Jun. 15, 2017, for International Application No. PCT/JP2017/012028.
(Continued)

Primary Examiner — Alexander S Thomas
(74) Attorney, Agent, or Firm — Sheridan Ross P.C.

(57) ABSTRACT

Disclosed herein is a laminated structure including a first layer covering a substrate and a raised portion existing on the substrate, and a second layer covering the first layer, in which a first seam is formed inside the first layer, starting from a part at which the raised portion rises from the substrate or a vicinity of the rising part as a start point, a second seam is formed inside the second layer, starting from a part at which the first layer positioned above the substrate rises or a part of the second layer corresponding to a vicinity of the rising part as a start point, and the first seam and the second seam are discontinuous.

6 Claims, 6 Drawing Sheets

(51) Int. Cl.
  *H01L 51/05* (2006.01)
  *H01L 51/42* (2006.01)
  *H01L 21/02* (2006.01)
  *H01L 23/10* (2006.01)
  *H01L 23/532* (2006.01)

(52) U.S. Cl.
  CPC ........ *H01L 21/76801* (2013.01); *H01L 23/10* (2013.01); *H01L 23/532* (2013.01); *H01L 51/0512* (2013.01); *H01L 51/42* (2013.01); *Y10T 428/19* (2015.01); *Y10T 428/195* (2015.01)

(56) References Cited

U.S. PATENT DOCUMENTS

| | | |
|---|---|---|
| 2005/0266650 A1 | 12/2005 | Ahn et al. |
| 2006/0108609 A1 | 5/2006 | Engel et al. |
| 2006/0273426 A1 | 12/2006 | Iijima |
| 2011/0204747 A1 | 8/2011 | Chen et al. |
| 2011/0241128 A1 | 10/2011 | O'Meara et al. |
| 2015/0294947 A1 | 10/2015 | Tomita et al. |

FOREIGN PATENT DOCUMENTS

| | | |
|---|---|---|
| JP | H04-029318 | 1/1992 |
| JP | H05-055165 | 3/1993 |
| JP | H07-221179 | 8/1995 |
| JP | 2001-308030 | 11/2001 |
| JP | 2006-324363 | 11/2006 |
| JP | 2015-204364 | 11/2015 |

OTHER PUBLICATIONS

Extended European Search Report for European Patent Application No. 17785732.3, dated Mar. 14, 2019, 7 pages.
Official Action (with English translation) for Chinese Patent Application No. 201780022850.3, dated Mar. 12, 2020, 16 pages.

* cited by examiner

LAMINATED STRUCTURE AND METHOD FOR PRODUCING THE SAME

CROSS REFERENCE TO RELATED APPLICATIONS

This application is a national stage application under 35 U.S.C. 371 and claims the benefit of PCT Application No. PCT/JP2017/012028 having an international filing date of 24 Mar. 2017, which designated the United States, which PCT application claimed the benefit of Japanese Patent Application No. 2016-084243 filed 20 Apr. 2016, the entire disclosures of each of which are incorporated herein by reference.

TECHNICAL FIELD

The present disclosure relates to a laminated structure and a method for producing the same.

In a structure in which a wiring layer is formed on a substrate, the substrate and the wiring layer are often coated with an insulating layer. Sometimes the insulating layer has a seam therein which extends from a part (or the vicinity thereof) at which the wiring layer rises from the substrate, as a start point. This seam allows chemicals, water, and undesirable gas to infiltrate therethrough, which is detrimental to reliability.

Means to address this problem is known as disclosed in Japanese Patent Laid-open No. H7-221179. The disclosure covers a method for producing a semiconductor device, the method including a step of forming a first layer of an interlayer insulating film on a metal wiring layer formed on a semiconductor substrate, a step of performing etch back by isotropic etching on the first layer of the interlayer insulating film, a step of forming a second layer of an interlayer insulating film on the first layer of the interlayer insulating film which has undergone etch back, and a step of planarizing the surface of the second layer of the interlayer insulating film by chemical polishing.

CITATION LIST

Patent Literature

[PTL 1]
Japanese Patent Laid-open No. H7-221179

SUMMARY

Technical Problem

The technology disclosed in the patent literature that the seam formed in the first layer does not extend into the second layer because the second layer is formed on the first layer after the first layer has undergone etch back by isotropic etching. In fact, however, this is not true. The etch back that is performed on the first layer by isotropic etching before the second layer is formed on the first layer causes the second seam to be formed in the second layer, with the second seam growing from a part (or the vicinity thereof) at which the first layer rises on the semiconductor substrate. Consequently, the second seam leads to the first seam, and this permits chemicals, water, and undesirable gas to migrate from the first seam to the second seam, thereby adversely affecting reliability.

It is an object of the present disclosure to provide a laminated structure and a method for producing the same, with the laminated structure being so configured as to securely prevent a raised portion from communicating with the outside through seams.

Solution to Problem

The present disclosure to address the foregoing problem discloses a laminated structure including:

a first layer covering a substrate and a raised portion existing on the substrate; and a second layer covering the first layer, in which a first seam is formed inside the first layer, starting from a part at which the raised portion rises from the substrate or a vicinity of the rising part as a start point of the first seam, a second seam is formed inside the second layer, starting from a part at which the first layer positioned above the substrate rises or a part of the second layer corresponding to a vicinity of the rising part as a start point of the second seam, and the first seam and the second seam are discontinuous.

The present disclosure to address the foregoing problem also discloses a method for producing a laminated structure, the method including:

a first step of forming a first layer covering a substrate and a raised portion existing on the substrate;

a second step of anisotropically etching the first layer to remain on the substrate and on a top face and a side face of the raised portion, after the first step; and a third step of forming a second layer covering the first layer, after the second step, in which a first seam is formed inside the first layer, starting from a part at which the raised portion rises from the substrate or a vicinity of the rising part as a start point of the first seam, a second seam is formed inside the second layer, starting from a part at which the first layer positioned above the substrate rises or a part of the second layer corresponding to a vicinity of the rising part as a start point of the second seam, and the first seam and the second seam are discontinuous.

Advantageous Effects of Invention

The present disclosure which relates to a laminated structure and a method for producing the same brings about the following effects. The laminated structure has its raised portion surely saved from chemicals, water, and undesirable gas entering the seams from the outside because the first seam and the second seam are discontinuous. This makes the laminated structure highly reliable. Note that the foregoing effects are merely exemplary and there may be additional effects.

DESCRIPTION OF EMBODIMENTS

Figure 1A:
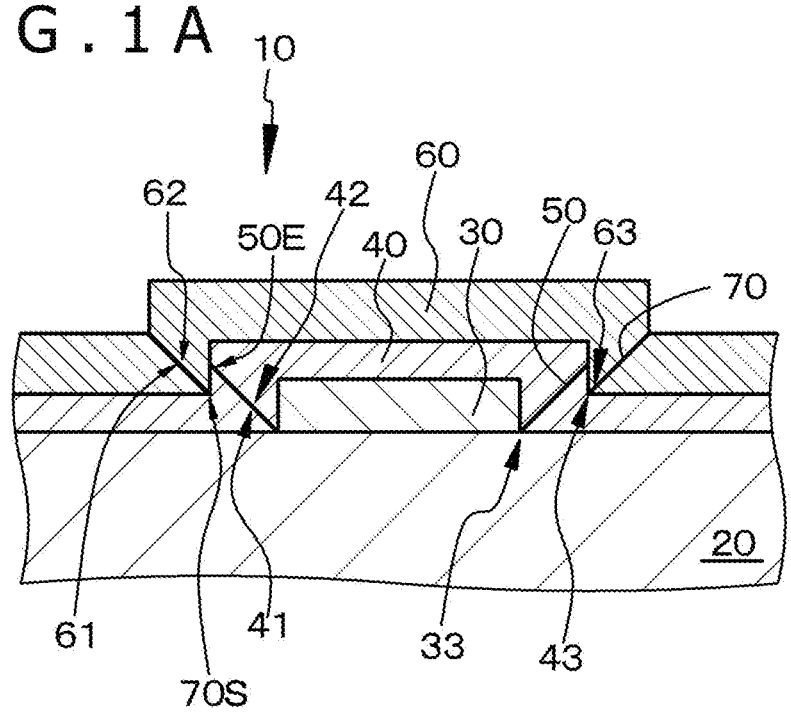
FIGS. 1A and 1B are partly cutout schematic sectional views depicting respectively a laminated structure according to Example 1 and a laminated structure according to a modification of Example 1.

The present disclosure will be described below on the basis of embodiments with reference to the drawings. However, the present disclosure is not limited to the embodiments and the various numerical values and materials in the embodiments are illustrative. The description proceeds in the order depicted below.
1. General Description of Laminated Structure and Method for Producing the Same According to Present Disclosure
2. Example 1 (for Laminated Structure and Method for Producing the Same According to Present Disclosure)
3. Example 2 (Modification of Example 1)
4. Others <General Description of Laminated Structure and Method for Producing the Same According to Present Disclosure>

In the laminated structure and the method for producing the same, A first layer and a second layer have a first seam and a second seam therein respectively, such that an end point of the first seam is above a starting point of the second seam, with these two points being preferably equal to or more than 5 nm apart. The first seam ends at its end point, which exists on the boundary between the first and second layers.

The substrate may be selected from various ones, each including insulation materials, conductive materials, and semiconductor materials. The raised portion may be a wiring layer including conductive material, various members (various components) included in a transistor, and various members (various components), such as photoelectric converter, included in a light emitting element or a receiving element and an optical sensor or an image sensor. Occasionally, the raised portion may be something originating from a foreign material present on the substrate. The raised portion may have a thickness (or height) ranging from $5 \times 10^{-8}$ to $1 \times 10^{-6}$ m, for example, without specific restrictions.

The substrate may be any one including glass, glass with an insulating film formed thereon, quartz, quartz with an insulating film formed thereon, a silicon semiconductor substrate, a silicon semiconductor substrate with an insulating film formed thereon, various compound semiconductor substrates, a metal substrate including various alloys such as stainless steel or various metals. Incidentally, the insulating film may be a silicon oxide-based material, such as $SiO_x$ and spin-on glass (SOG), silicon nitride ($SiN_Y$), silicon oxynitride (SiON), aluminum oxide ($Al_2O_3$), metal oxide, or metal salt. The substrate may also be a conductive substrate with an insulating film formed thereon (such as substrate including metal, like gold and aluminum, or highly oriented graphite). Examples of the substrate may include an organic polymer including polymethyl methacrylate (PMMA), polyvinyl alcohol (PVA), polyvinyl phenol (PVP), polyethersulfone (PES), polyimide, polycarbonate (PC), polyethylene terephthalate (PET), and polyethylene naphthalate (PEN). The substrate of organic polymer may be a flexible substrate including a plastic film, a plastic sheet, or a plastic substrate. Using the substrate having such a flexible polymer enables an electronic device to be incorporated or integrated in an electronic apparatus having a curved surface. A silanol derivative may be formed on a front face of the substrate by the silane coupling method, a thin film including a thiol derivative, a carboxylic acid derivative, a phosphoric acid derivative or the like may be formed on the front face of the substrate by the SAM method or the like, and a thin film including an insulating metal salt or metal complex may be formed on the front face of the substrate by the CVD method or the like, thereby enhancing the adhesiveness between the substrate and the raised portion.

Alternatively, examples of the substrate may include inorganic insulating materials including such metal oxides and metal nitrides, such as silicon oxide, silicon nitride ($SiN_Y$), silicon oxynitride (SiON), hafnium oxide ($HfO_2$), zirconium oxide ($ZrO_2$), aluminum oxide ($Al_2O_3$), aluminum-hafnium oxide ($HfAlO_2$), silicon-hafnium oxide (HfSiO), tantalum oxide ($Ta_2O_5$), yttrium oxide ($Y_2O_3$), lanthanum oxide ($La_2O$), and metal silicates such as HfSiO, HfSiON, ZrSiO, AlSiO, and LaSiO. The materials derived from silicon oxide include silicon oxide ($SiO_x$), BPSG, PSG, BSG, AsSG, PbSG, and SOG (spin-on-glass). The inorganic insulating material may be an inorganic insulating material which includes one or more than one constituent. The substrate of inorganic insulating material may be of single layer structure or multiple layer structure, and it may be formed by the PVD method or the CVD method.

Alternatively, examples of the substrate may include organic insulating materials such low-dielectric materials as polyarylether, cycloperfluorocarbon polymer and benzocyclobutene, cyclic fluororesin, polytetrafluoroethylene, fluorinated aryl ether, fluorinated polyimide, amorphous carbon, and organic SOG; polymethyl methacrylate (PMMA), and polyvinyl phenol (PVP); polyvinyl alcohol (PVA); polyimide; polycarbonate (PC); polyethylene terephthalate (PET); polystyrene; silanol derivatives (silane coupling agents) such as N-2(aminoethyl)3-aminopropyltrimethoxysilane (AEAPTMS), 3-mercaptopropyltrimethoxysilane (MPTMS), and octadecyltrichlorosilane (OTS); and organic polymers exemplified with linear aromatic hydrocarbons, including octadecanethiol and dodecylisocyanate, which have a terminal functional group capable of bonding to a conductive material. The foregoing organic insulating materials may be used in combination with one another. The substrate including the foregoing organic insulating materials is formed by any one of the PVD method, the CVD method, the spin-coating method, the coating method, the sol-gel method, the electrodeposition method, the shadow mask method, and the spray method.

Alternatively, examples of the substrate may include such conductive materials as metallic materials such as aluminum (Al), titanium (Ti), gold (Au), silver (Ag), tungsten (W), niobium (Nb), tantalum (Ta), molybdenum (Mo), chromium (Cr), copper (Cu), nickel (Ni), cobalt (Co), zirconium (Zr), iron (Fe), platinum (Pt), and zinc (Zn); alloys and compounds containing the foregoing metallic elements, which are exemplified by nitrides such as TiN and silicides such as $WSi_2$, $MoSi_2$, $TiSi_2$, and $TaSi_2$; semiconductors such as silicon (Si), and transparent conductive materials. The substrate may be of single-layer or multi-layer structure. The transparent conductive materials include those containing indium atoms listed below: indium oxide, indium-tin oxide (ITO, containing Sn-doped $In_2O_3$, crystalline or amorphous ITO), indium-zinc oxide (IZO), indium-gallium oxide (IGO), indium-doped gallium-zinc oxide (IGZO or In—

GaZnO$_4$), and IFO (F-doped In$_2$O$_3$). The transparent conductive materials further include, as a base layer, the following: tin oxide (SnO$_2$), ATO (Sb-doped SnO$_2$), FTO (F-doped SnO$_2$), Zinc oxide (ZnO, optionally doped with Al, B, or Ga), antimony oxide, oxide of spinel structure, oxide of YbFe$_2$O$_4$ structure, gallium oxide, titanium oxide, niobium oxide, and nickel oxide. The substrate may include the foregoing conductive materials by any known thin-film forming technology selected from the CVD method, sputtering method, the vapor deposition method, the lift-off method, the ion-plating method, the electrolytic plating method, the electroless plating method, the screen printing method, the laser ablation method, and the sol-gel method.

Alternatively, the substrate may also include a silicon semiconducting material selected from the foregoing silicon semiconductor and compound semiconductor. Another example of the substrate may be a substrate in the form of SOI.

The substrate may be planar or uneven. In the latter case, for example, the raised portion may be provided on a protection of the substrate, in some cases, or on a recess of the substrate, in some cases, or alternatively, on both of a projection and a recess of the substrate, in some cases.

In the substrate of double-layer structure, the first and second layers may include the same or different materials which are inorganic insulating materials and conductive materials. The two layers may be formed by the PVD method or the CVD method. The PVD method includes, for example, (a) the vacuum vapor deposition method such as the electron beam heating method, the resistance heating method, the flash evaporation method, and the pulse laser deposition (PLD) method, (b) the plasma vapor deposition method, and (c) the bipolar sputtering method, the direct current (DC) sputtering method, the DC magnetron sputtering method, the high-frequency sputtering method, the magnetron sputtering method, the ion beam sputtering method and the bias-sputtering method. The CVD method includes, for example, the normal pressure CVD method, the reduced CVD method, the hot CVD method, and the plasma CVD method.

As mentioned above, the raised portion may be a photoelectric converter constituting a light-receiving element, an optical sensor, or an image sensor. The photoelectric converter may be that of laminate structure including a first electrode, a photoelectric converting layer, and a second electrode. In a case where the photoelectric converting layer includes an organic photoelectric converting material, the photoelectric converting layer may include any one of (1) a single layer structure including a p-type organic semiconductor,
(2) a single layer structure including an n-type organic semiconductor,
(3) a laminated layer structure including a layer of a p-type organic semiconductor and a layer of an n-type organic semiconductor; including a layer of a p-type organic semiconductor, a layer of a mixture of a p-type organic semiconductor and an n-type organic semiconductor (in bulk heterostructure), and a layer of an n-type organic semiconductor; including a layer of a p-type organic semiconductor and a layer of a mixture of a p-type organic semiconductor and an n-type organic semiconductor (in bulk heterostructure); or including a layer of an n-type organic semiconductor and a layer of a mixture of a p-type organic semiconductor and an n-type organic semiconductor (in bulk heterostructure), and
(4) a single layer structure including a mixture of a p-type organic semiconductor and an n-type organic semiconductor (in bulk heterostructure). The order of lamination may be changed as desired.

The p-type organic semiconductor includes, for example, naphthalene derivative, anthracene derivative, phenanthrene derivative, pyrene derivative, perylene derivative, tetracene derivative, pentacene derivative, quinacridone derivative, thiophene derivative, thienothiophene derivative, benzothiophene derivative, triarylamine derivative, carbazole derivative, perylene derivative, picene derivative, chrysene derivative, fluoranthene derivative, phthalocyanine derivative, subphthalocyanine derivative, subporphyrazine derivative, metal complex containing heterocyclic compound as ligand, polythiophene derivative, polybenzothiadiazole derivative, and polyfluorene derivative. The n-type organic semiconductor includes, for example, fullerene and fullerene derivatives, an organic semiconductor having larger (deeper) HOMO or LUMO than the p-type organic semiconductors, and transparent inorganic metal oxides. The n-type organic semiconductor includes heterocyclic compounds (containing nitrogen atoms, oxygen atoms, or sulfur atoms) such as pyridine derivative, pyrazine derivative, pyrimidine derivative, triazine derivative, quinoline derivative, quinoxaline derivative, isoquinoline derivative, acridine derivative, phenazine derivative, phenanthroline derivative, tetrazole derivative, pyrazole derivative, imidazole derivative, thiazole derivative, oxazole derivative, imidazole derivative, benzoimidazole derivative, benzotriazole derivative, benzoxazole derivative, benzooxazole derivative, carbazole derivative, benzofuran derivative, dibenzofuran derivative, subporphyradine derivative, polyphenylenevinylene derivative, polybenzothiadiazole derivative, organic molecules having a polyfluorene derivative as part of the molecular skeleton, organometal complex, and subphthalocyanine derivative. The photoelectric converting layer including an organic photoelectric converting material (which will be referred to as "organic photoelectric converting layer" hereinafter) is not specifically restricted in thickness. The thickness broadly ranges from $1\times10^{-8}$ to $5\times10^{-7}$ m, preferably from $2.5\times10^{-8}$ to $3\times10^{-7}$ m, more preferably from $2.5\times10^{-8}$ to $2\times10^{-7}$ m, and most desirably from $1\times10^{-7}$ to $1.8\times10^{-7}$ m. Incidentally, the organic semiconductor is usually classified into p-type and n-type, and this implies that p-type easily transports holes and n-type easily transports electrons. This does not mean that the organic semiconductor has holes or electrons as thermally excited majority carriers like an inorganic semiconductor.

Alternatively, the organic photoelectric converting layer that converts green light into electric charges may include a material containing rhodamine dye, merocyanine dye, quinacridone derivative, subphthalocyanine dye, pigment violet, pigment red, or the like. The organic photoelectric converting layer that converts blue light into electric charges may include a material containing coumaric acid dye, tris(8-hydroxyquinoline)aluminum (Alq3), merocyanine dye, naphthalene derivative, anthracene derivative, naphthacene derivative, styrylamine derivative, bis(azinyl)methene boron complex, or the like.

The organic photoelectric converting layer that converts red light into electric charges may include a material containing a phthalocyanine dye, subphthalocyanine dye, Nile red, pyran derivative such as DCM1 {4-(dicyanomethylene)-2-methyl-6-(4-dimethylaminostyryl)4H-pyran} and DCJT {4-(dicyanomethylene)-2-tert-butyl-6-(julolidilstyryl)pyran}, squarylium derivative, porphyrin derivative, chlorin derivative, eurodilin derivative, or the like.

Each of the organic layers may be formed by either the dry film forming method or the wet film forming method. The dry film forming method is accomplished by vacuum vapor deposition (that employs resistance heating or high-frequency heating), EB vapor deposition, sputtering (such as magnetron sputtering, RF-DC coupled bias sputtering, ECR sputtering, facing target sputtering, and high-frequency sputtering), ion plating, laser ablation, molecular beam epitaxy, and laser transfer. The CVD method includes the plasma CVD method, the hot CVD method, the MOCVD method, and the light CVD method. The wet film forming method includes spin coating, ink jet coating, spray coating, stamping, microcontact printing, flexographic printing, offset printing, gravure printing, and dipping. The patterning may be accomplished by chemical etching (with shadow mask, laser transfer, and photolithography) and physical etching (with ultraviolet rays and laser). Each of the organic layers is planarized by laser planarizing and reflowing.

Alternatively, the photoelectric converting layer may include an inorganic material selected from the following: crystalline silicon, amorphous silicon, microcrystalline silicon, crystalline selenium, amorphous selenium, and the compounds listed below: chalcopyrite compound, such as CIGS (CuInGaSe), CIS (CuInSe$_2$), CuInS$_2$, CuAlS$_2$, CuAlSe$_2$, CuGaS$_2$, CuGaSe$_2$, AgAlS$_2$, AgAlSe$_2$, AgInS$_2$, and AgInSe$_2$ or III-V group compound, such as GaAs, InP, AlGaAs, InGaP, AlGaInP, and InGaAsP and a compound semiconductor, such as CdSe, CdS, In$_2$Se$_3$, In$_2$S$_3$, Bi$_2$Se$_3$, Bi$_2$S$_3$, ZnSe, ZnS, PbSe, and PbS.

The first electrode and the second electrode may include a transparent conductive material. The electrode including a transparent conductive material will be referred to as a "transparent electrode" hereinafter. The transparent electrode may include a conductive metal oxide, which includes the following, for example: indium oxide, indium-tin oxide (ITO, containing Sn-doped In$_2$O$_3$, crystalline or amorphous ITO), indium-zinc oxide (IZO) [zinc oxide doped with indium], indium-gallium oxide (IGO) [gallium oxide doped with indium], indium-gallium-zinc oxide (IGZO, In—GaZnO$_4$) [zinc oxide doped with indium and gallium], IFO (F-doped In$_2$O$_3$), tin oxide (SnO$_2$), ATO (Sb-doped SnO$_2$), FTO (F-doped SnO$_2$), zinc oxide (including ZnO doped with other elements), aluminum-zinc oxide (AZO) [zinc oxide doped with aluminum], gallium-zinc oxide (GZO) [zinc oxide doped with gallium], titanium oxide (TiO$_2$), niobium-titanium oxide (TNO) [titanium oxide doped with niobium], antimony oxide, oxide of spinel structure, and oxide of YbFe$_2$O$_4$ structure. Alternatively, the transparent electrode may have, as the base layer, gallium oxide, titanium oxide, niobium oxide, or nickel oxide. The transparent electrode may have a thickness ranging from $2 \times 10^{-8}$ m to $2 \times 10^{-7}$ m, preferably from $3 \times 10^{-8}$ m to $1 \times 10^{-7}$ m. Alternatively, in the case where the electrode does not need transparency, the anode that supplies holes should preferably include a conductive material having a high work function (for example, $\phi=4.5$ to $5.5$ eV). It typically includes, for example, gold (Au), silver (Ag), chromium (Cr), nickel (Ni), palladium (Pd), platinum (Pt), iron (Fe), iridium (Ir), germanium (Ge), osmium (Os), rhenium (Re), and tellurium (Te). On the other hand, the cathode that supplies electrons should preferably include a conductive material having a low work function (for example, $\phi=3.5$ to $4.5$ eV). It typically includes, for example, alkali metal (such as Li, Na, and K) and fluoride or oxide thereof, alkaline earth metal (such as Mg and Ca) and fluoride or oxide thereof, aluminum (Al), zinc (Zn), tin (Sn), thallium (Tl), sodium-potassium alloy, aluminum-lithium alloy, magnesium-silver alloy, indium, a rare-earth metal such as ytterbium, and alloys thereof. Alternatively, examples of the anode and cathode may include the following materials: platinum (Pt), gold (Au), palladium (Pd), chromium (Cr), nickel (Ni), aluminum (Al), silver (Ag), tantalum (Ta), tungsten (W), copper (Cu), titanium (Ti), indium (In), tin (Sn), iron (Fe), cobalt (Co), and molybdenum (Mo), and alloys thereof (in the form of conductive particles). Such conductive substances as polysilicon (containing impurities), carbonaceous material, an oxide semiconductor, carbon nanotube, and graphene. The electrodes may take on a laminate structure. Moreover, the anode and cathode may also include organic materials (conductive polymers) such as poly(3,4-ethylenedioxythiophen)/polystyrenesulfonic acid [PEDOT/PSS]. The foregoing conductive materials may be used in the form of mixture (paste or ink) with a binder (polymer), after curing.

The first electrode and the second electrode (anode and cathode) in the form of a film may be prepared by either the dry method or the wet method. The dry method includes the PVD method and the CVD method (chemical vapor deposition). The PVD method is classified into vacuum vapor deposition (that relies on resistance heating or high-frequency heating), electron beam (EB) deposition, sputtering (such as magnetron sputtering, RF-DC coupled bias sputtering, ECR sputtering, facing target sputtering, and high-frequency sputtering), ion plating, laser ablation, molecular beam epitaxy, and laser transfer. The CVD method is classified into plasma CVD, heat CVD, organometal (MO) CVD, and photo CVD. The wet method includes electrolytic plating, electroless plating, spin coating, ink jet coating, spray coating, stamping, microcontact printing, flexographic printing, offset printing, gravure printing, and dipping. The patterning may be accomplished by either chemical etching (which relies on shadow mask, laser transfer, and photolithography) or physical etching (that relies on ultraviolet rays and laser beam). The first and second electrodes may be planarized by the laser planarizing method, the reflow method, or the chemical mechanical polishing (CMP) method.

The organic photoelectric converting layer and the first electrode may face each other with a first carrier blocking layer interposed between them. Alternatively, the organic photoelectric converting layer and the second electrode may face each other with a second carrier blocking layer interposed between them. Moreover, the first carrier blocking layer and the first electrode may be made to face each other with a first charge injection layer interposed between them. The second carrier blocking layer and the second electrode may be made to face each other with a second charge injection layer interposed between them. For example, examples of an electron injection layer may include alkali metals, including lithium (Li), sodium (Na), and potassium (K), fluorides thereof, and oxides thereof, or alkaline earth metals, including magnesium (Mg) and calcium (Ca), fluorides thereof, and oxides thereof, for example.

In this step, formation of the first layer starts from a front face of the substrate, a side face of the raised portion, and a top face of the raised portion. Specifically, a formation interface of the first layer (1A: formation front) is formed from a front face of a part of the substrate close to the part at which the raised portion rises from the substrate, and a formation interface of the first layer (1B: formation front) is formed from the side face. As a result of growth of the formation fronts in the first layer, the formation fronts meet each other, whereby a first seam is formed. Likewise, in the formation of the second layer, a formation interface of the second layer (2A: formation front) is formed from a front face in a vicinity of a part at which the first layer positioned above the substrate rises, and a formation interface of the second layer (2B: formation front) is formed from a front face in a vicinity of a part at which the first layer positioned above the raised portion rises. As a result of growth of the formation fronts in the second layer, the formation fronts meet each other, whereby a second seam is formed.

Example 1

Example 1 covers the laminated structure and the method for producing the same, according to the present disclosure.

Example 1 deals with a laminated structure 10 depicted in FIG. 1A which is a schematic partly cutaway sectional view. The laminated structure 10 includes a first layer 40 which covers a substrate 20 and a raised portion 30 existing on the substrate 20, and a second layer 60 which covers the first layer 40.

The first layer 40 has therein a first seam 50 which extends from a starting point 33 which corresponds to a part (or a vicinity thereof) at which the raised portion 30 rises from the substrate 20. In addition, the second layer 60 has therein a second seam 70 which extends from a starting point 63 of the second layer 60 which corresponds to a part (or a vicinity thereof) at which the first layer 40 existing on the substrate 20 rises. The first seam 50 and the second seam 70 are discontinuous.

FIG. 1A depicts that the first layer 40 has the cross section which follows the contours of the substrate 20 and the raised portion 30. Likewise, the second layer 60 has the cross section which follows the contours of the substrate 20 and the raised portion 30. The cross sections of the first layer 40 and the second layer 60 are not restricted to them illustrated but may vary depending on the cross section of the raised portion 30 and the conditions under which the first and second layers 40 and 60 are formed. This applies also to Example 2.

The first seam 50 is formed in such a way that it extends from the starting point 33 to an end point 50E, which exists on the interface between the first layer 40 and the second layer 60, and the end point 50E is above a starting point 70S of the second seam 70. To be concrete, the end point 50E of the first seam 50 and the starting point 70S of the second seam 70 are equal to or more than 5 nm apart. Incidentally, although the figure depicts that the first and second layers 40 and 60 have rectangular cross sections and that the first layer 40 rises at right angles from the substrate 20, the angular part 43 may occasionally be rounded. This applies also to Example 2.

In Example 1, the substrate 20 includes an inorganic insulating material, such as $SiO_2$, and the raised portion 30 is a wiring layer including a conductive material, such as aluminum. The first layer 40 includes SiN and the second layer 60 includes $SiO_2$. Below the substrate 20, provided are various members (various components) included in a transistor such as a field-effect transistor (FET) or a thin-film transistor (TFT), for example. Alternatively, the raised portion 30 may be a layer of an organic semiconductor material which constitutes the active layer (or extended part thereof) of an organic thin-film transistor.

According to Example 1, the laminated structure is produced by the method illustrated in FIGS. 3A, 3B, and 3C and FIGS. 4A and 4B, which are schematic partly cutaway sectional views.

[Step-100]

Figure 3A:
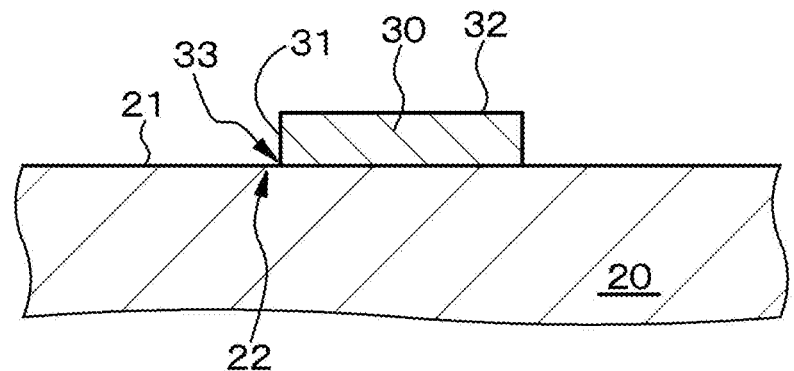
FIGS. 3A, 3B, and 3C are partly cutout schematic sectional views, each depicting a method for producing a laminated structure according to Example 1.
Figure 3B:
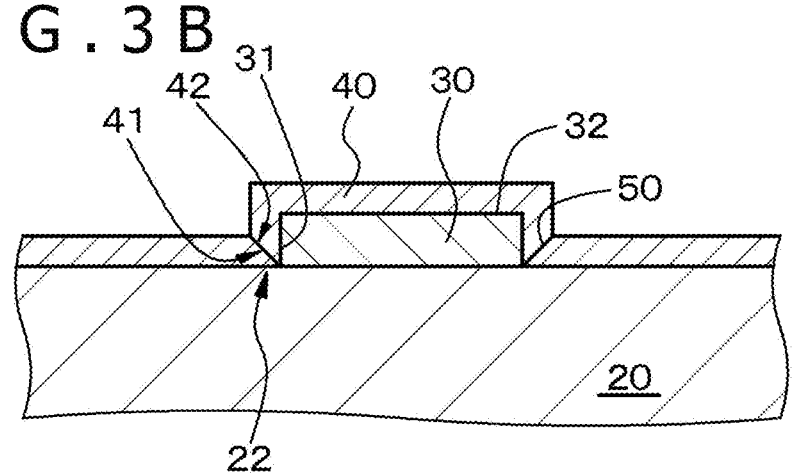
Figure 3C:
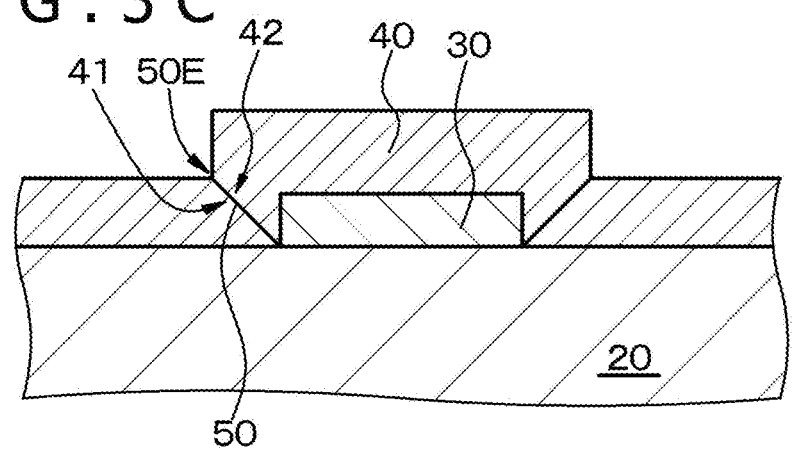

The process starts with forming the first layer 40 which covers the substrate 20 and the raised portion 30 existing on the substrate 20. To be specific, the substrate 20 carrying the raised portion (wiring layer) 30 thereon undergoes sputtering, as depicted in FIG. 3A, so that the substrate 20 and the raised portion 30 existing thereon are covered with the first layer 40, as depicted in FIGS. 3B and 3C.

In this step, formation of the first layer 40 starts from a front face 21 of the substrate 20, a side face 31 of the raised portion 30, and a top face 32 of the raised portion 30. Specifically, a formation interface of the first layer 40 (1A: formation front 41) is formed from a front face of a part 22 of the substrate 20 close to the part 33 at which the raised portion 30 rises from the substrate 20, and a formation interface of the first layer 40 (1B: formation front 42) is formed from the side face 31. As a result of growth of the first layer 40, the formation front 41 meets the formation front 42 (see FIGS. 3B and 3C), whereby a first seam 50 is formed.

[Step-110]

Figure 4A:
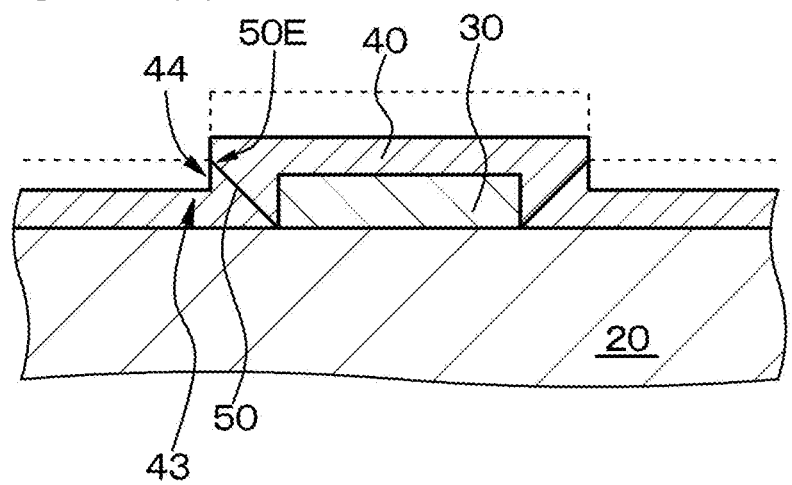
FIGS. 4A and 4B are partly cutout schematic sectional views depicting steps of the method that follow the step depicted in FIG. 3C for producing a laminated structure according to Example 1.

In the next step, the first layer 40 undergoes anisotropic etching, so that the first layer 40 remains on the substrate 20, the top face 32 of the raised portion 30, and the side face 31 of the raised portion 30, as depicted in FIG. 4A. The anisotropic etching mostly etches out a part of the first layer 40 which is above the substrate 20 and a part of the first layer 40 which is above the top face 32 of the raised portion 30, with a part of the first layer 40 which is on the side face 31 of the raised portion 30 substantially remaining unetched. The dotted line in FIG. 4A indicates the position of the first layer 40 which has existed before the anisotropic etching.

[Step-120]

Figure 4B:
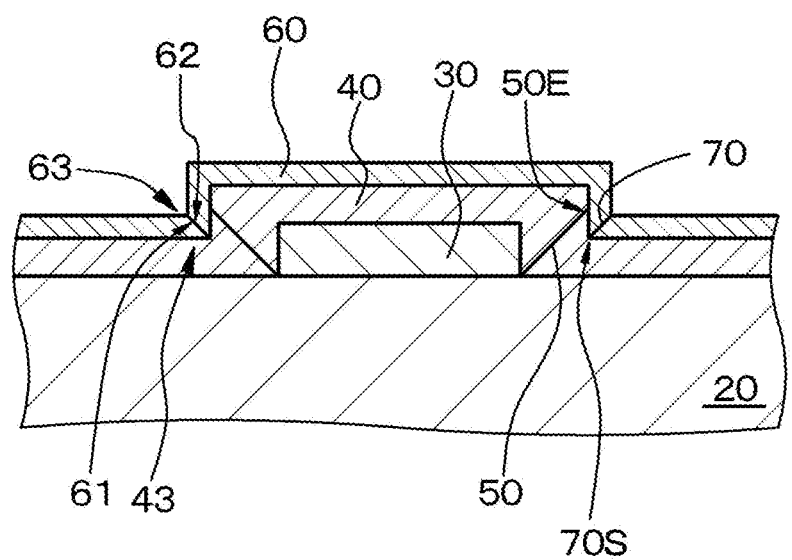

The subsequent step is to form the second layer 60 which covers the first layer 40 (see FIGS. 4B and 1A). To be concrete, sputtering is performed to form the second layer 60 that covers the first layer 40.

In the formation of the second layer 60, a formation interface of the second layer (2A: formation front 61) is formed from a front face in a vicinity of a part 43 at which the first layer 40 positioned above the substrate 20 rises, and a formation interface of the second layer (2B: formation front 62) is formed from a front face in a vicinity of a part 44 at which the first layer 40 positioned above the raised portion 30 rises. As a result of growth of the formation fronts in the second layer, the formation fronts meet each other, whereby a second seam 70 is formed.

Thus, the laminated structure of Example 1 having the structure depicted in FIG. 1A can be obtained. In the laminated structure and the method for producing the same in Example 1, the first layer is subjected to anisotropic etching, whereby the first seam and the second seam become discontinuous. The discontinuous seams securely prevent infiltration of chemicals, water, and undesirable gas, which makes the laminated structure more reliable.

Figure 1B:
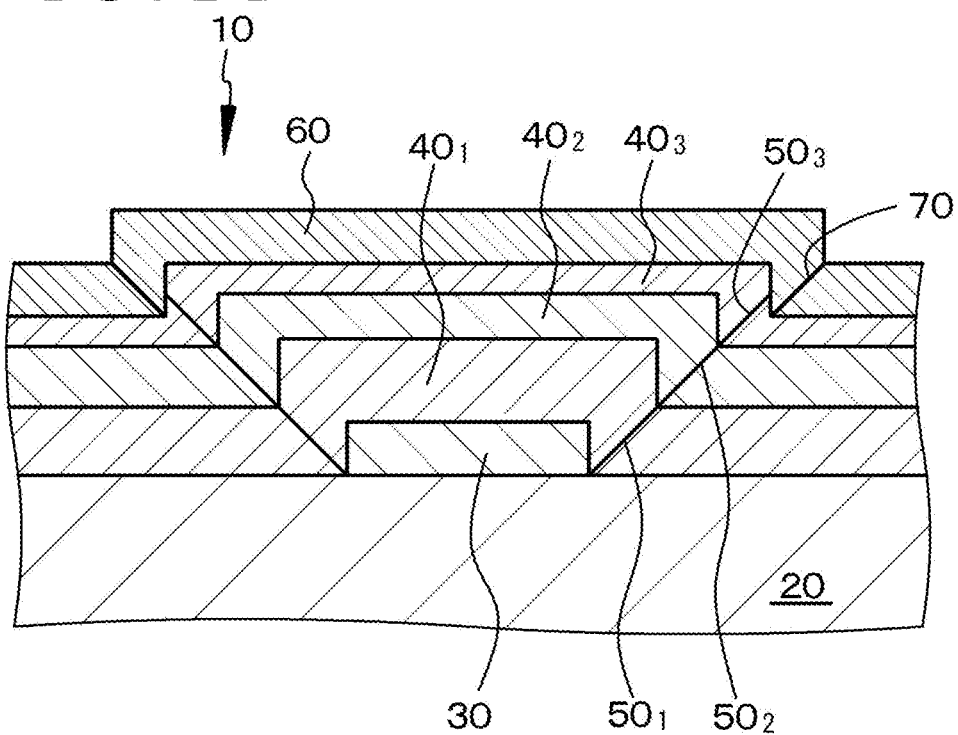
Figure 2A:
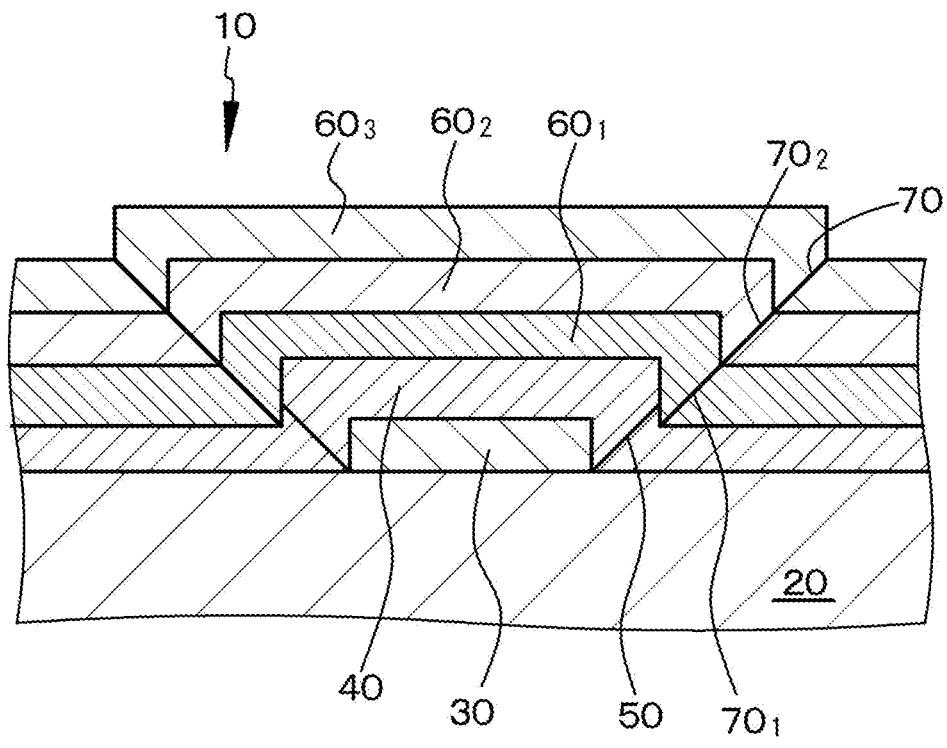
FIGS. 2A and 2B are partly cutout schematic sectional views depicting a laminated structure according to additional modifications of Example 1.
Figure 2B:
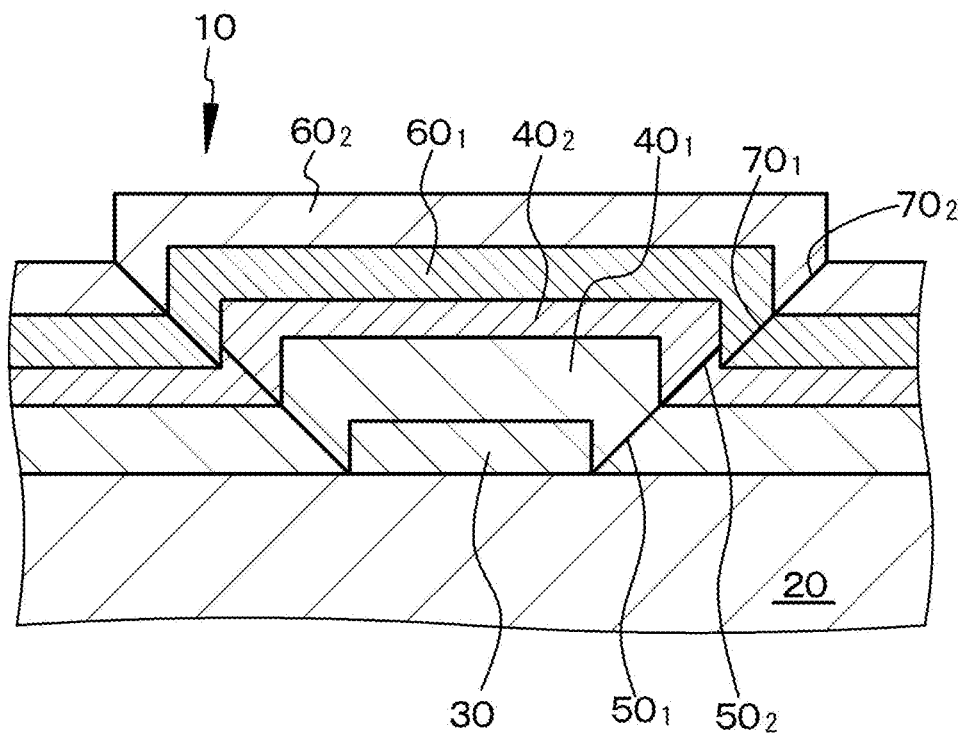

The laminated structure according to Example 1 may be modified as depicted in FIGS. 1B, 2A, and 2B.

One modification to the laminated structure according to Example 1 is depicted in FIG. 1B.

The laminated structure in the modification includes the first layer covering the substrate 20 and the raised portion 30 existing on the substrate 20, and the second layer 60 covering the first layer. The first layer includes as many layers as M (M denoting an integer not smaller than 2; M=3 in the illustrated case). The layers numbered m (m=1, 2, . . . M) as a constituent of the first layer is designated as the layers numbered $40_1$, $40_2$, and $40_3$, respectively. They have therein first seams $50_1$, $50_2$, and $50_3$, respectively, with each seam starting from a part (or a vicinity thereof) at which the raised portion 30 rises.

Inside the second layer 60, the second seam 70 is formed, starting from a part at which the layer numbered $40_3$ as a constituent of the first layer positioned above the substrate 20 rises or a part of the second layer 60 corresponding to a vicinity of the rising part, as a start point of the second seam 70.

The first seam $50_3$ in the layer numbered $40_3$ as a constituent of the first layer and the second seam 70 are discontinuous.

Herein, the substrate 20 is a layer of an inorganic insulating material or $SiO_2$. The raised portion 30 is a wiring layer of a conductive material such as aluminum. Also, the layers numbered $40_1$, $40_2$, and $40_3$ (constituting the first layer) include $SiO_2$, SiN, and $SiO_2$, respectively. The second layer 60 includes a conductive material such as tungsten and aluminum. These materials for the substrate 20, the raised portion 30, the layers numbered $40_1$, $40_2$, and $40_3$ and the second layer 60 are mere examples and not restrictive.

The example depicted in FIG. 1B is characterized in that the layer numbered $40_1$ as a constituent of the first layer has therein the first seam $50_1$, the layer numbered $40_2$ as a constituent of the first layer has therein the first seam $50_2$, and the layer numbered $40_3$ as a constituent of the first layer has therein the first seam $50_3$. These first seams $50_1$, $50_2$, and $50_3$ are connected to one another.

Another modification to the laminated structure according to Example 1 is depicted in FIG. 2A.

The laminated structure in the modification includes the first layer 40 covering the substrate 20 and the raised portion 30 existing on the substrate 20, and the second layer covering the first layer 40. The second layer includes as many layers as N (N denoting an integer not smaller than 2; N=3 in the illustrated case). The first layer 40 has therein the first seam 50 which starts from a part (or a vicinity thereof) at which the raised portion 30 rises from the substrate 20. The layer numbered n (n=1, 2, ... N) as a constituent of the second layer is designated as the layers numbered $60_1$, $60_2$, and $60_3$, respectively. They have therein second seams numbered $70_1$, $70_2$, and $70_3$, respectively. The second seams $70_1$, $70_2$, and $70_3$ start from those parts of the layers numbered $60_1$, $60_2$, and $60^3$ which correspond to a part (or a vicinity thereof) at which the first layer 40 above the substrate 20 rises.

The first seam 50 in the first layer 40 is discontinuous from the second seam $70_1$ in the layer numbered $60_1$ as a constituent of the second layer.

The substrate 20 includes an inorganic insulating material such as $SiO_2$. The raised portion 30 is a wiring layer of a conductive material such as aluminum. The first layer 40 includes $SiO_2$. The layers numbered $60_1$ and $60_2$ in the second layer include $SiO_2$ and SiN, respectively. The layer numbered $60_3$ in the second layer includes a conductive material such as tungsten and aluminum. These materials for the substrate 20, the raised portion 30, the first layer 40 and the layers numbered $60_1$, $60_2$, and $60_3$ are mere examples and not restrictive.

The example depicted in FIG. 2A is characterized in that the first layer 40 has therein the first seam 50, and the layers numbered $60_1$, $60_2$, and $60_3$ constituting the second layer have therein the second seams $70_1$, $70_2$, and $70_3$, respectively.

These second seams $70_1$, $70_2$, and $70_3$ are continuous one another.

Another modification in the laminated structure according to Example 1 is depicted in FIG. 2B.

The laminated structure in the modification includes the first layer that covers the substrate 20 and the raised portion 30 existing on the substrate 20, and the second layer covering the first layer. The first layer includes as many layers as M (M denoting an integer not smaller than 2; M=2 in the illustrated case). The second layer includes as many layers as N (N denoting an integer not smaller than 2; N=2 in the illustrated case).

The layers numbered m (m=1, 2, ... M) as a constituent of the first layer is designated as the layers numbered $40_1$ and $40_2$, respectively. They have therein first seams $50_1$ and $50_2$, respectively. The first seams $50_1$ and $50_2$ start from the part (or a vicinity thereof) at which the raised portion 30 rises from the substrate 20. The layer numbered n (n=1, 2, ... N) as a constituent of the second layer is designated as the layers numbered $60_1$ and $60_2$, respectively. They have therein second seams numbered $70_1$ and $70_2$, respectively. The second seams $70_1$ and $70_2$ start from the part (or a vicinity thereof) at which the layer numbered $40_2$ as a constituent of the first layer above the substrate 20 rises.

There is no connection between the first seam $50_2$ in the layer $40_2$ as a constituent of the first layer and the second seam $70_1$ in the layer $60_1$ as a constituent of the second layer.

The substrate 20 is a layer of an inorganic insulating material such as $SiO_2$. The raised portion 30 is a wiring layer of a conductive material such as aluminum. The layers numbered $40_1$ and $40_2$ as constituents of the first layer include $SiO_2$ and SiN, respectively. The layers numbered $60_1$ and $60_2$ as constituents of the second layer include SiN and conductive material (such as tungsten and aluminum), respectively. However, these materials for the substrate 20, the raised portion 30, the layers numbered $40_1$ and $40_2$ and the layers numbered $60_1$ and $60_2$ are mere examples and not restrictive.

The example depicted in FIG. 2B is characterized in that the layer numbered $40_1$ as a constituent of the first layer has therein the first seam $50_1$, and the layer numbered $40_2$ as a constituent of the first layer has therein the first seam $50_2$, and these first seams $50_1$ and $50_2$ are connected to one another. It is also characterized in that the layer numbered $60_1$ as a constituent of the second layer has therein the second seam $70_1$, and the layer numbered $60_2$ as a constituent of the second layer has therein the second seam $70_2$, and these second seams $70_1$ and $70_2$ are connected to one another.

Example 2

Example 2 is a modification of Example 1. In Example 2, a raised portion 130 includes photoelectric converters constituting light-receiving element, an optical sensor, or an image sensor. The photoelectric converter includes a first electrode 130A, a photoelectric converting layer 130C covering the first electrode 130A, and a second electrode 130B formed on the top face of the photoelectric converting layer 130C. The first electrode 130A is paired with each photoelectric converter. On the other hand, the photoelectric converting layer 130C and the second electrode 130B are continuous through a plurality of the photoelectric converter. In other words, the photoelectric converting layer 130C and the second electrode 130B take on the form of a continuous film. The photoelectric converting layer 130C includes the above-mentioned organic photoelectric converting material. The photoelectric converter is not restricted in constitution and structure to that mentioned above.

In Example 2, the substrate 20 includes an inorganic insulating material, such as $SiO_2$, and the raised portion 130 includes a plurality of photoelectric converters as mentioned above. A first layer 140 includes a metal wiring material (such as tungsten), and a second layer 160 includes SiN. Below the substrate 20, provided are various members (various components) included in a transistor (drive circuit) such as a field effect transistor (FET) or a thin-film transistor (TFT), to drive the photoelectric converter. The first electrode 130A and the second electrode 130B are connected to the drive circuit through the contact holes (not depicted) in the substrate 20. In the illustrated example, the first layer 140 is so formed as to come into contact with an edge of the photoelectric converting layer 130C and the second electrode 130B.

Alternatively, below the substrate 20, another photoelectric converter may be provided, so that an imaging element of laminate type can be made. The photoelectric converter provided below the substrate 20 may be a photoelectric converter which is formed on a silicon semiconductor substrate, photoelectric converter which is formed on a compound semiconductor substrate, or photoelectric converter which includes an organic photoelectric converting material. The imaging element of laminate type is exemplified as follows.

(1) Laminate structure including a photoelectric converter sensitive to blue light and a photoelectric converter sensitive to red light
(2) Laminate structure including a photoelectric converter sensitive to green light and a photoelectric converter sensitive to red light
(3) Laminate structure including a photoelectric converter sensitive to green light, a photoelectric converter sensitive to blue light, and a photoelectric converter sensitive to red light
(4) Laminate structure including a photoelectric converter sensitive to blue light, a photoelectric converter sensitive to green light, and a photoelectric converter sensitive to red light
(5) Laminate structure including a photoelectric converter sensitive to red light and a photoelectric converter sensitive to infrared light
(6) Laminate structure including a photoelectric converter sensitive to green light and a photoelectric converter sensitive to infrared light
(7) Laminate structure including a photoelectric converter sensitive to blue light and a photoelectric converter sensitive to infrared light
(8) Laminate structure including a photoelectric converter sensitive to blue light, a photoelectric converter sensitive to red light, and a photoelectric converter sensitive to infrared light
(9) Laminate structure including a photoelectric converter sensitive to green light, a photoelectric converter sensitive to red light, and a photoelectric converter sensitive to infrared light
(10) Laminate structure including a photoelectric converter sensitive to green light, a photoelectric converter sensitive to blue light, a photoelectric converter sensitive to red light, and a photoelectric converter sensitive to infrared light
(11) Laminate structure including a photoelectric converter sensitive to blue light, a photoelectric converter sensitive to green Light, a photoelectric converter sensitive to red light, and a photoelectric converter sensitive to infrared light The photoelectric converters mentioned above are arranged along the direction of light entry.

According to Example 2, the laminated structure is produced by the method illustrated in FIGS. 5A, 5B, and 5C and FIGS. 6A and 6B, which are schematic partly cutaway sectional views of the substrates and the like.

[Step-200]

Figure 5A:
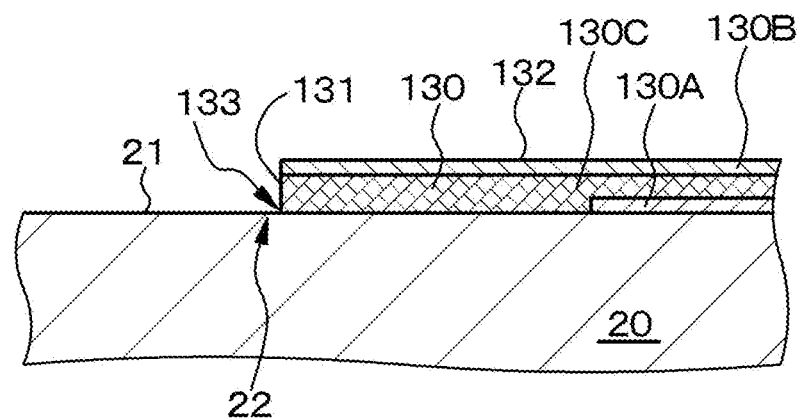
FIGS. 5A, 5B, and 5C are partly cutout schematic sectional views, each depicting a method for producing a laminated structure according to Example 2.
Figure 5B:
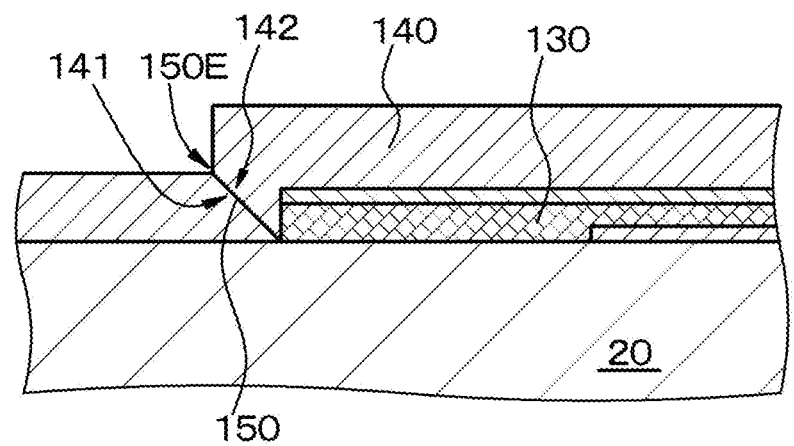
Figure 5C:
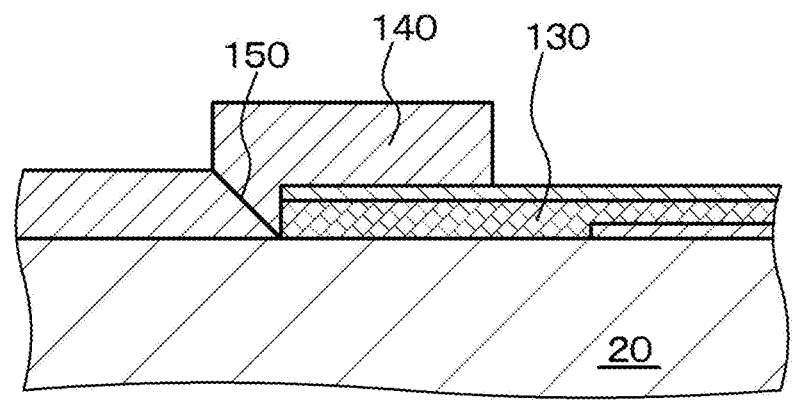

The process starts with forming the first layer 140 which covers the substrate 20 and the raised portion 130 existing on the substrate 20. To be specific, the substrate 20 carrying the raised portion (photoelectric converter) 130 thereon undergoes sputtering, as depicted in FIG. 5A, so that the substrate 20 and the raised portion 130 existing thereon are covered with the first layer 140, as depicted in FIG. 5B. The next step is performed to partly remove the first layer 140 which has been formed on a top face of the raised portion 130, with part of the first layer 140 (of metal wiring material) remaining on a top face 132 of the edge of the raised portion 130, on a side face 131 of the raised portion 130, and on the substrate 20, as depicted in FIG. 5C.

In this step, the first layer 140 starts to form on the front face 21 of the substrate 20, the side face 131 of the raised portion 130, and the top face 132 of the raised portion 130. That part (front 141) of the first layer 140 which rises from the part 22 of the substrate 20 close to a part 133 at which the raised portion 130 rises from the substrate 20 meets that part (front 142) of the first layer 140 which rises sideward from the side face 131 of the raised portion 130, with the result that a first seam 150 is formed, as depicted in FIG. 5B.

[Step-210]

Figure 6A:
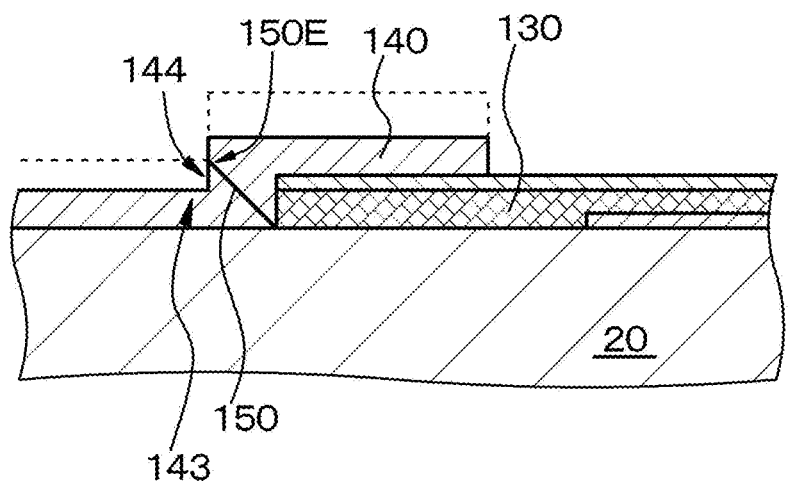
FIGS. 6A and 6B are partly cutout schematic sectional views depicting steps of the method that follow the step depicted in FIG. 5C for producing a laminated structure according to Example 2.

In the next step, the first layer 140 undergoes anisotropic etching, so that the first layer 140 remains on the substrate 20, the top face 132 of the raised portion 130, and the side face 131 of the raised portion 130, as depicted in FIG. 6A. The anisotropic etching mostly etches out a part of the first layer 140 which is above the substrate 20 and a part of the first layer 140 which is above the top face 132 of the raised portion 130, with a part of the first layer 140 which is on the side face 131 of the raised portion 130 substantially remaining unetched.

[Step-220]

Figure 6B:
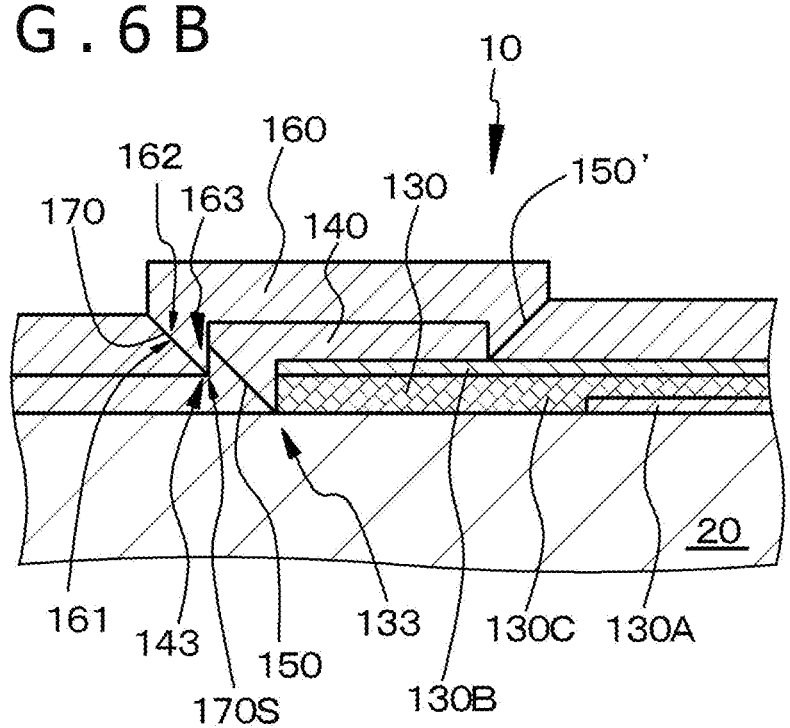

The subsequent step is to form a second layer 160 which covers the first layer 140 (see FIG. 6B). To be concrete, sputtering is performed to form the second layer 160 that covers the first layer 140.

In the formation of the second layer 160, a formation interface of the second layer (2A: formation front 161) is formed from a front face in a vicinity of a part 143 at which the first layer 140 positioned above the substrate 20 rises, and a formation interface of the second layer (2B: formation front 162) is formed from a front face in a vicinity of a part 144 at which the first layer 140 positioned above the raised portion 130 rises. As a result of growth of the formation fronts in the second layer, the formation fronts meet each other, whereby a second seam 170 is formed.

Thus, the laminated structure of Example 2 having the structure depicted in FIG. 6B can be obtained. In the laminated structure and the method for producing the same in Example 2, the first layer is subjected to anisotropic etching, whereby the first seam and the second seam become discontinuous. The discontinuous seams securely prevent infiltration of chemicals, water, and undesirable gas, which makes the laminated structure more reliable.

Note that, when a reference sign 150E represents a Part of the first seam 150 (positioned in the interface between the first layer 140 and the second layer 160) as the end point where the first seam 150 terminates, the end point 150E of the first seam 150 is positioned above a start point 170S of the second seam 170. To be concrete, the end point 150E of the first seam 150 is equal to or more than 5 nm away from the start point 170S of the second seam 170.

The foregoing example may be modified as follows. That is, the second layer 160 may be covered with the third layer. In this case, the second layer 160 is regarded as the first layer and the third layer regarded as the second layer. Alternatively, the "Step-210" may be omitted. In this case, the resulting laminated structure is regarded as including the first layer (in place of the second layer 160) and the second layer (in place of the third layer). Here, the second layer 160 which is regarded as the first layer is called "the first' layer" and the third layer which is regarded as the second layer is called "the second' layer," for convenience's sake. According to this terminology, the laminated structure is defined as including a first' layer that covers a substrate and a raised portion existing on the substrate, and a second' layer that covers the first' layer, with the first' layer having a first seam formed therein which extends from a part (or a vicinity thereof) at which the raised portion rises from the substrate, and the second' layer having a second seam formed therein which extends from that part of the second' layer which corresponds to a part (or a vicinity thereof) of the first' layer at which the first' layer lying on the substrate rises, with the first seam and the second seam being discontinuous.

The present disclosure has been disclosed above with reference to some preferred embodiments. The embodiments are not intended to restrict the scope of the present disclosure. The laminated structure and the method for producing the same, which have been demonstrated in the embodiments, are mere examples, and the structure and materials may be variously changed as desired. That is, Example 1 demonstrates the instance in which the raised portion is entirely covered with the first layer and the first layer is entirely covered with the second layer. This may be modified such that the first layer is formed at a part (or a vicinity thereof) at which the raised portion rises. In this instance, the first layer is not formed on part of the top face of the raised portion and the first layer is not formed on a part of substrate which is away from the raised portion. Another instance may be possible in which the second layer is formed at a part (or a vicinity thereof), at which the first layer rises. In other words, the second layer is not formed on a part of the first layer which exists above the raised portion, and the second layer is not formed on the first layer away from the raised portion. The forgoing is applicable to Example 2. In the case demonstrated in Example 2, the first layer partly covers the raised portion, but the first layer may be formed differently so that it entirely covers the raised portion.

Note that the present disclosure may adopt the following configurations.

<Laminated Structure>

[A01]

A laminated structure including:

a first layer covering a substrate and a raised portion existing on the substrate; and a second layer covering the first layer, in which a first seam is formed inside the first layer, starting from a part at which the raised portion rises from the substrate or a vicinity of the rising part as a start point of the first seam, a second seam is formed inside the second layer, starting from a part at which the first layer positioned above the substrate rises or a part of the second layer corresponding to a vicinity of the rising part as a start point of the second seam, and the first seam and the second seam are discontinuous.

[A02]

The laminated structure as defined in [A01] above, in which, when a part of the first seam positioned on an interface between the first layer and the second layer is defined as an end point of the first seam, the end point of the first seam is positioned above the start point of the second seam.

[A03]

The laminated structure as defined in [A02] above, in which the end point of the first seam is 5 nm or more away from the start point of the second seam.

[A04]

A laminated structure including:

a first layer covering a substrate and a raised portion existing on the substrate; and a second layer covering the first layer, in which the first layer includes M layers (M denoting an integer not smaller than 2), a first seam is formed inside a layer numbered m (note that m=1, 2, . . . M) constituting the first layer, starting from a part at which the raised portion rises from the substrate or a vicinity of the rising part as a start point of the first seam, a second seam is formed inside the second layer, starting from a part at which the layer numbered M constituting the first layer positioned above the substrate rises or a part of the second layer corresponding to a vicinity of the raising part as a start point of the second seam, and the first seam in the layer numbered M constituting the first layer, and the second seam are discontinuous.

[A05]

A laminated structure including:

a first layer covering a substrate and a raised portion existing on the substrate; and a second layer covering the first layer, in which the second layer includes N layers (N denoting an integer not smaller than 2), a first seam is formed inside the first layer, starting from a part at which the raised portion rises from the substrate or a vicinity of the rising part as a start point of the first seam, a second seam is formed inside a layer numbered n (note that n=1, 2, . . . N) constituting the second layer, starting from a part at which the first layer positioned above the substrate rises or a part of the layer numbered n of the second layer corresponding to a vicinity of the rising part as a start point of the second seam, and the first seam in the first layer and the second seam in the layer numbered 1 constituting the second layer are discontinuous.

A laminated structure including:

a first layer covering a substrate and a raised portion existing on the substrate; and a second layer covering the first layer, in which the first layer includes M layers (M denoting an integer not smaller than 2), the second layer includes N layers (N denoting an integer not smaller than 2), a first seam is formed inside a layer numbered m (note that m=1, 2, . . . M) constituting the first layer, starting from a part at which the raised portion rises from the substrate or a vicinity of the rising part as a start point of the first seam, a second seam is formed inside a layer numbered n (note that n=1, 2, . . . N) constituting the second layer, starting from a part of the layer numbered M constituting the first layer positioned above the substrate or a part of the layer numbered n of the second layer corresponding to a vicinity of the rising part as a start point of the second seam, and the first seam in the layer numbered M constituting the first layer, and the second seam in the layer numbered 1 constituting the second layer are discontinuous.

<Method for Producing Laminated Structure>

[B01]

A method for producing a laminated structure, the method including:

a first step of forming a first layer covering a substrate and a raised portion existing on the substrate;

a second step of anisotropically etching the first layer to remain on the substrate and on a top face and a side face of the raised portion, after the first step; and a third step of forming a second layer covering the first layer, after the second step, in which a first seam is formed inside the first layer, starting from a part at which the raised portion rises from the substrate or a vicinity of the rising part as a start point of the first seam, a second seam is formed inside the second layer, starting from a part at which the first layer positioned above the substrate rises or a part of the second layer corresponding to a vicinity of the rising part as a start point of the second seam, and the first seam and the second seam are discontinuous.

[B02]

The method for producing a laminated structure as defined in [B01] above, in which, when a part of the first seam positioned in an interface between the first layer and the second layer is defined as an end point of the first seam, the end point of the first seam is positioned higher than the start point of the second seam.

[B03]

The method for producing a laminated structure as defined in [B02] above, in which the end point of the first seam is 5 nm or more away from the start point of the second seam.

[B04]

A method for producing a laminated structure, the method including:

a first step of forming a first layer covering a substrate and a raised portion existing on the substrate;

a second step of anisotropically etching the first layer to remain on the substrate and on a top face and a side face of the raised portion, after the first step; and a third step of forming a second layer covering the first layer, after the second step, in which the first layer includes N layers (N denoting an integer not smaller than 2), a first seam is formed inside a layer numbered m (note that m=1, 2, . . . N), starting from a part at which the raised portion rises from the substrate or a vicinity of the rising part as a start point of the first seam, a second seam is formed inside the second layer, starting from a part at which the layer numbered N constituting the first layer positioned above the substrate or a part of the second layer corresponding to a vicinity of the rising part as a start point of the second seam, and the first seam in the layer numbered N constituting the first layer, and the second seam are discontinuous.

[B05]

A method for producing a laminated structure, the method including:

a first step of forming a first layer covering a substrate and a raised portion existing on the substrate;

a second step of anisotropically etching the first layer to remain on the substrate and on a top face and a side face of the raised portion, after the first step; and a third step of forming a second layer covering the first layer, after the second step, in which the second layer includes N layers (N denoting an integer not smaller than 2), a first seam is formed inside the first layer, starting from a part at which the raised portion rises from the substrate or a vicinity of the rising part as a start point of the first seam, a second seam is formed inside a layer numbered n (note that n=1, 2, . . . N) constituting the second layer, starting from a part at which the first layer positioned above the substrate rises or a part of the layer numbered n of the second layer corresponding to a vicinity of the rising part as a start point of the second seam, and the first seam in the first layer, and the second seam in the layer numbered 1 constituting the second layer are discontinuous.

[B06]

A method for producing a laminated structure, the method including:

a first step of forming a first layer covering a substrate and a raised portion existing on the substrate;

a second step of anisotropically etching the first layer to remain on the substrate and on a top face and a side face of the raised portion, after the first step; and a third step of forming a second layer covering the first layer, after the second step, in which the first layer includes M layers (M denoting an integer not smaller than 2), the second layer includes N layers (N denoting an integer not smaller than 2), a first seam is formed inside a layer numbered m (note that m=1, 2, . . . M) constituting the first layer, starting from a part at which the raised portion rises from the substrate or a vicinity of the rising part as a start point of the first seam, a second seam is formed inside a layer numbered n (note that n=1, 2, . . . N) constituting the second layer, starting from a part of the layer numbered M constituting the first layer positioned above the substrate or a part of the layer numbered n of the second layer corresponding to a vicinity of the rising part as a start point of the second seam, and the first seam in the layer numbered M constituting the first layer, and the second layer in the layer numbered 1 constituting the second layer are discontinuous.

REFERENCE SIGNS LIST

10 . . . Laminated structure
20 . . . Substrate
21 . . . Front face of the substrate
22 . . . Part of the substrate in a vicinity of a part at which a raised portion rises from the substrate
30 . . . Raised portion
130 . . . Raised portion (photoelectric convertor)
130A . . . First electrode
130B . . . Second electrode
130C . . . Photoelectric converting layer
31, 131 . . . Side face of the raised portion
33, 133 . . . Top face of the raised portion
40, $40_1$, $40_2$, $40_3$, 140 . . . First layer
41, 141 . . . 1A Formation front
42, 142 . . . 1B Formation front
43, 143 . . . Part at which the first layer positioned above the substrate rises 44, 144 . . . Part at which the first layer positioned above the raised portion rises
50, $50_1$, $50_2$, $50_3$, 150 . . . First seam
50E . . . End point of the first seam
60, $60_1$, $60_2$, $60_3$, 160 . . . Second layer
61, 161 . . . 2A formation front
62, 162 . . . 2B formation front
63 . . . Part of the second layer corresponding to a part at which the first layer positioned above the substrate rises or a vicinity of the rising part
70, $70_1$, $70_2$, $70_3$, 170 . . . Second seam
70S . . . Start point of the second seam

What is claimed is:

1. A laminated structure comprising:
    a first layer covering a substrate and partly covering a raised portion existing on the substrate, wherein a first seam is formed inside the first layer, starting from a part at which the raised portion rises from the substrate; and
    a second layer covering the first layer and a remaining portion of the raised portion not covered by the first layer, wherein a second seam is formed inside the second layer, wherein the first seam and the second seam are discontinuous, and wherein a third seam is formed inside the second layer at a point where the first layer partly covering the raised portion ends.

2. The laminated structure according to claim 1, wherein an end point of the first seam is positioned above a start point of the second seam.

3. The laminated structure according to claim 2, wherein the end point of the first seam is 5 nm or more away from the start point of the second seam.

4. A method for producing a laminated structure, the method comprising:
    a first step of forming a first layer covering a substrate and a raised portion existing on the substrate, wherein a first seam is formed inside the first layer, starting from a part at which the raised portion rises from the substrate;
    a second step of anisotropically etching the first layer to remain on the substrate and a portion on a top face and a side face of the raised portion, after the first step; and
    a third step of forming a second layer covering the first layer, after the second step, wherein a second seam is formed inside the second layer, wherein the first seam and the second seam are discontinuous, and wherein a third seam is formed inside the second layer at a point where the first layer partly covering the raised portion ends.

5. The method for producing a laminated structure according to claim 4, wherein an end point of the first seam is positioned higher than a start point of the second seam.

6. The method for producing a laminated structure according to claim 5, wherein the end point of the first seam is 5 nm or more away from the start point of the second seam.

* * * * *